US011656546B2

United States Patent
Roy et al.

(10) Patent No.: US 11,656,546 B2
(45) Date of Patent: May 23, 2023

(54) EXPOSURE APPARATUS FOR UNIFORM LIGHT INTENSITY AND METHODS OF USING THE SAME

(71) Applicant: CANON KABUSHIKI KAISHA, Tokyo (JP)

(72) Inventors: Nilabh K. Roy, Austin, TX (US); Mario Johannes Meissl, Austin, TX (US); Masaki Saito, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/802,702

(22) Filed: Feb. 27, 2020

(65) Prior Publication Data

US 2021/0271161 A1 Sep. 2, 2021

(51) Int. Cl.
*G03F 7/00* (2006.01)

(52) U.S. Cl.
CPC ................................. *G03F 7/0002* (2013.01)

(58) Field of Classification Search
CPC .................................................... G03F 7/0002
See application file for complete search history.

(56) References Cited

U.S. PATENT DOCUMENTS

| | | | |
|---|---|---|---|
| 6,702,648 | B1 | 3/2004 | Avanzino et al. |
| 6,756,307 | B1 | 6/2004 | Kelly et al. |
| 7,179,079 | B2 | 2/2007 | Sreenivasan et al. |
| 7,303,383 | B1 | 12/2007 | Sreenivasan et al. |
| 7,377,765 | B2 | 5/2008 | Bandic et al. |
| 7,906,180 | B2 | 3/2011 | Xu et al. |
| 8,303,291 | B2 | 11/2012 | Kirchner et al. |
| 2002/0094496 | A1 | 7/2002 | Choi et al. |
| 2003/0073310 | A1 | 4/2003 | Olgado et al. |

(Continued)

FOREIGN PATENT DOCUMENTS

| | | |
|---|---|---|
| JP | 2006264253 A | 10/2006 |
| JP | 4928963 B2 | 5/2012 |
| WO | 2005032791 A1 | 4/2005 |

OTHER PUBLICATIONS

Curie, M. et al. "Customized low-angle lefiactive diffusers for high power laser applications," PowerPhotonic Ltd., Dalgety Bay, KY119PF, Scotland, UK; 2016, 10 pages.

Colburn, M. et al., "Step and Flash Imprint Lithography: A New Approach to High-Resolution Patterning," Proc. SPIE 3676, Emerging Lithographic Technologies III, 1999, 11 pages.

Jeon, J-W et al., "A New Three-Dimensional Lithography Using Polymer Dispersed Liquid Crystal (PDLC) Films," Department of Electrical Engineering and Computer Science, MEMS, 2006, pp. 110-113.

(Continued)

*Primary Examiner* — Nathan H Empie
(74) *Attorney, Agent, or Firm* — Abel Schillinger, LLP

(57) ABSTRACT

A method of forming a planarization layer on a substrate is disclosed. The method can include aligning a superstrate with the substrate, where aligning the superstrate with the substrate comprises tuning a diffusing element to a first operational state, dispensing a formable material over the substrate, contacting the formable material over the substrate with the superstrate, tuning the diffusing element to a second operational state, where the first operational state is different from the second operational state, and curing the formable material over the substrate to form a layer over the substrate while the superstrate is contacting the formable material, where curing the formable material can include directing a set of actinic radiation beams to enter the diffusing element at an entering state and exit the diffusing element at an exiting state, and where the entering state is different from the exiting state.

17 Claims, 6 Drawing Sheets

(56) References Cited

U.S. PATENT DOCUMENTS

| | | | |
|---|---|---|---|
| 2006/0012770 A1* | 1/2006 | Dierichs | G03F 7/70075 355/71 |
| 2007/0023853 A1* | 2/2007 | Partain | G01T 1/24 257/443 |
| 2007/0190196 A1* | 8/2007 | Bandic | B82Y 40/00 425/174.4 |
| 2008/0105355 A1 | 5/2008 | Kumar et al. | |
| 2010/0012622 A1* | 1/2010 | Panga | G03F 7/70483 216/52 |
| 2011/0014499 A1 | 1/2011 | Uchida et al. | |
| 2011/0041910 A1 | 2/2011 | Shimomura et al. | |
| 2011/0070462 A1 | 3/2011 | Uchida et al. | |
| 2011/0180965 A1* | 7/2011 | Zhang | B29C 59/02 264/293 |
| 2011/0216523 A1 | 9/2011 | Tong et al. | |
| 2012/0313295 A1* | 12/2012 | Den Boef | B82Y 40/00 264/406 |
| 2016/0318066 A1 | 11/2016 | Sreenivasan et al. | |
| 2017/0333940 A1 | 11/2017 | Sreenivasan et al. | |
| 2018/0074418 A1* | 3/2018 | Bamesberger | G03F 9/7042 |
| 2018/0247823 A1 | 8/2018 | LaBrake et al. | |
| 2019/0377259 A1 | 12/2019 | Kimura | |
| 2020/0219765 A1 | 7/2020 | Chen et al. | |
| 2021/0050218 A1 | 2/2021 | Ozturk et al. | |
| 2021/0125855 A1 | 4/2021 | Roy et al. | |
| 2021/0373437 A1 | 12/2021 | Cone et al. | |
| 2021/0407797 A1 | 12/2021 | Roy et al. | |

OTHER PUBLICATIONS

Jeon, J-W et al., "Sloping Profile and Pattern Transfer to Silicon by Shape-Controllable 3-D Lithography and ICP," Department of Electrical Engineering and Computer Science, Sensors and Actuators A 139, 2007, pp. 281-286.

McKenna, L. et al., "Polymer Dispersed Liquid Crystal Films for Modulating Infra-Red Radiation," Department of Electrical and Electronic Engineering, Polymer 45, 2004, pp. 6977-6984.

Natarajan, L. V. et al., "Switchable Holographic Polymer-Dispersed Liquid Crystal Reflection Gratings Based on Thiol-Ene Photopolymerization," Air Force Research Laboratory, Materials and Manufacturing Directorate, Chem. Materials, 2003, 15, pp. 2477-2484.

Ren, H. et al., "Tunable Fresnel Lens Using Nanoscale Polymer-Dispersed Liquid Crystals," School of Optics, Applied Physics Letters, vol. 83, No. 8, 2003, pp. 1515-1517.

Spruce, G. et al., "Polymer Dispersed Liquid Crystal (PDLC) Films," Electronics & Communication Engineering Journal, 1992, pp. 91-100.

Sreenivasan, S. V. et al., "Low-Cost Nanostructure Patterning Using Step and Flash Imprint Lithography," Proceedings of SPIE—The International Society for Optical Engineering, vol. 4608, 1992, pp. 187-194.

Takei, S. et al., "Nanoparticle Free Polymer Blends for Light Scattering Films in Liquid Crystal Displays," Applied Physics Letters, vol. 100, 2012, pp. 263108-1-263108-4.

* cited by examiner

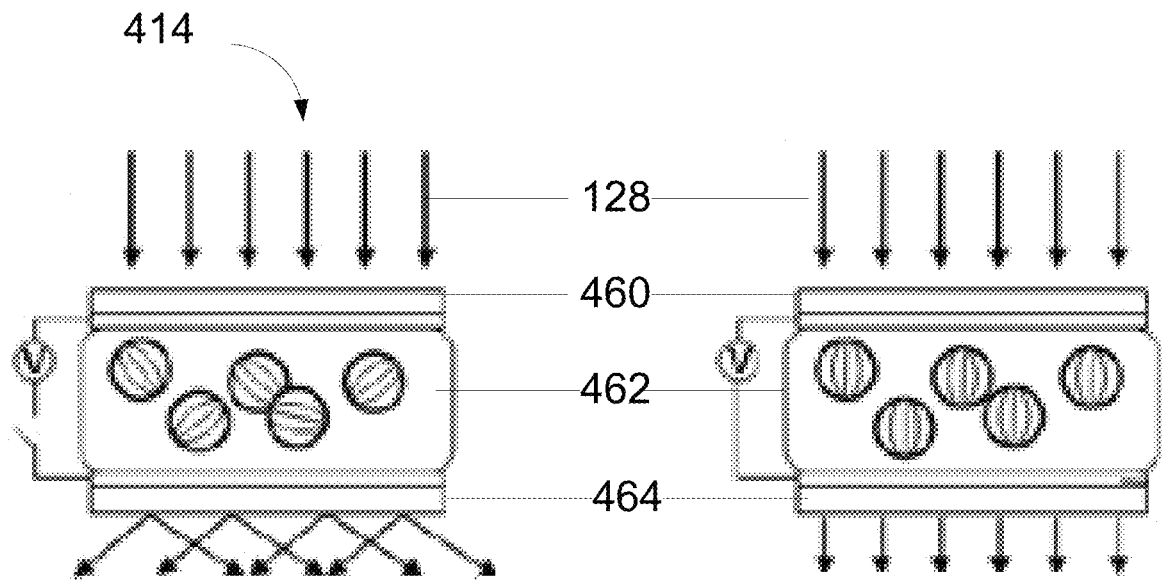
FIG. 4A                    FIG. 4B
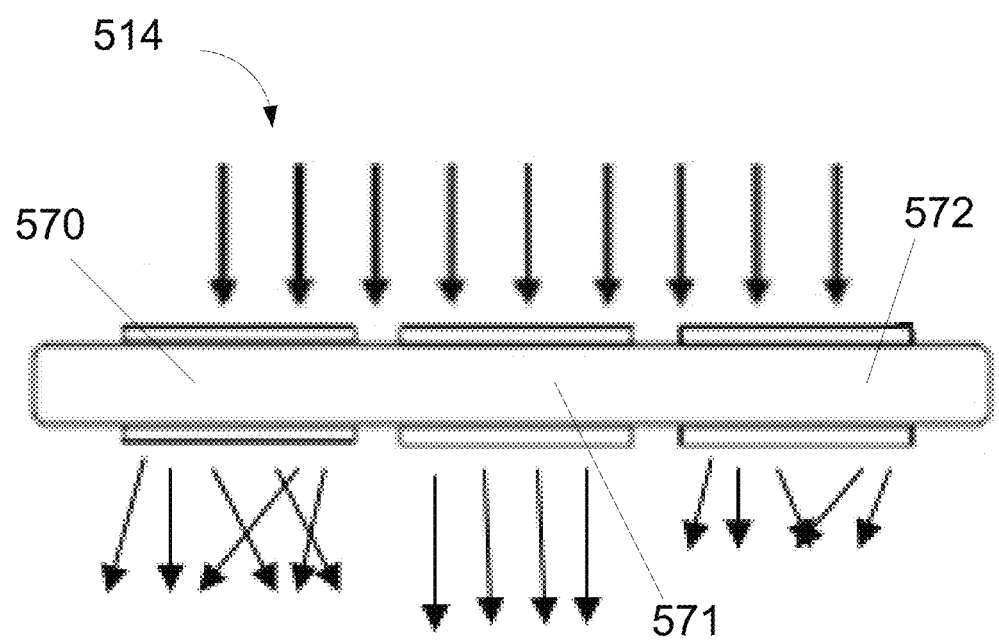
FIG. 5

EXPOSURE APPARATUS FOR UNIFORM LIGHT INTENSITY AND METHODS OF USING THE SAME

FIELD OF THE DISCLOSURE

The present disclosure relates to substrate processing, and more particularly to whole wafer fluid deposition in semiconductor fabrication.

RELATED ART

Fluid deposition techniques are useful in fabricating electronic devices on semiconductor wafers. Such techniques can include the use of fluid dispense systems for depositing a formable material onto the wafer. A superstrate planarizes and/or patterns the dispensed material before the dispensed material is solidified on the wafer. Planarization techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization improves depth of focus (DOF), critical dimension (CD), and critical dimension uniformity. In extreme ultraviolet lithography (EUV), planarization improves feature placement and DOF. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed.

However, defects can arise as collimated light is deflected by the superstrate chuck prior to reaching the polymerizable material. As such, improvements in fluid processing techniques are desired to allow for whole wafer processing.

SUMMARY

In an aspect a method of forming a planarization layer on a substrate is disclosed. The method can include aligning a superstrate with the substrate, where aligning the superstrate with the substrate comprises tuning a diffusing element to a first operational state, dispensing a formable material over the substrate, contacting the formable material over the substrate with the superstrate, tuning the diffusing element to a second operational state, where the first operational state is different from the second operational state, and curing the formable material over the substrate to form a layer over the substrate while the superstrate is contacting the formable material, where curing the formable material can include directing a set of actinic radiation beams to enter the diffusing element at an entering state and exit the diffusing element at an exiting state, and where the entering state is different from the exiting state.

In another aspect, the entering state can be collimated beams.

In yet another aspect, the exiting state can be diffused beams.

In yet another aspect, the method can further include directing a set of light beams through the diffusing element while aligning the superstrate with the substrate.

In yet another aspect, where the set of light beams enter the diffusing element as collimated beams and exit the diffusing element as collimated beams.

In another aspect, the method can further include providing a camera and lighting system to align the superstrate with the substrate.

In a further aspect, the diffusing element is between the camera and lighting system, and the substrate.

In another aspect, the diffusing element comprises a first layer, a second layer, and a third layer.

In another aspect, the first layer comprises a material selected from the group consisting of silicone, limestone, soda ash, quartz, silica, silicates, silicon dioxide, sodium oxide, sodium carbonate, calcium oxide, and any combination thereof.

In yet another aspect, the second layer comprises polyethylene terephthalate, indium tin oxide, polymer dispersed liquid crystal, or any combination thereof.

In another aspect, the third layer comprises a material selected from the group consisting of silicone, limestone, soda ash, quartz, silica, silicates, silicon dioxide, sodium oxide, sodium carbonate, calcium oxide, and any combination thereof.

In yet another aspect, the first layer is spaced apart into at least two sections, the second layer is a continuous layer, and the third layer is separated into at least two sections.

In a further aspect, the diffusing element can include three zones.

In yet another aspect, the set of actinic radiation beams exit the first zone at a different state than the beams exiting the second zone.

In another aspect, the set of actinic radiation beams exit the first zone at a different state than the beams exiting the third zone.

In another aspect, a method of manufacturing is disclosed. The method of manufacturing can include aligning a superstrate with the substrate, wherein aligning the superstrate with the substrate comprises tuning a diffusing element to a first operational state, dispensing a formable material over the substrate, contacting the formable material over the substrate with the superstrate, tuning the diffusing element to a second operational state, where the first operational state is different from the second operational state, curing the formable material over the substrate to form a layer over the substrate while the superstrate is contacting the formable material, where curing the formable material comprises directing a set of actinic radiation beams to enter the diffusing element at an entering state and exit the diffusing element at an exiting state, and where the entering state is different from the exiting state, separating the superstrate and the layer on the substrate, processing the substrate on which the layer has been formed, and manufacturing the article from the processed substrate.

In another aspect, a system of planarizing a substrate is disclosed. The system can include a substrate chuck to hold the substrate, a superstrate chuck to hold a superstrate, where the superstrate faces the substrate, a tunable diffuser, wherein the tunable diffuser comprises a first operational state and a second operational state, where the second operational state diffuses energy beams, a camera to inspect the substrate through the tunable diffuser, the superstrate chuck, and the superstrate, where the tunable diffuser is between the camera and the superstrate chuck, and a radiation source to provide actinic radiation beams to the substrate through the tunable diffuser, the superstrate chuck, and the superstrate, wherein the tunable diffuser is between the radiation source and the superstrate chuck.

In another aspect, the tunable diffuser comprises a first layer, a second layer, and a third layer.

In yet another aspect, the second layer comprises polyethylene terephthalate, indium tin oxide, polymer dispersed liquid crystal, or any combination thereof.

In a further aspect, the first layer is spaced apart into at least two sections, the second layer is a continuous layer, and the third layer is separated into at least two sections.

BRIEF DESCRIPTION OF THE DRAWINGS

Embodiments are illustrated by way of example and are not limited in the accompanying figures.

FIGS. 4A and 4B include an embodiment of a diffusing element, according to one implementation of the method of FIG. 3.

FIG. 5 includes an embodiment of a diffusing element, according to another embodiment.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts.

Figure 1A:
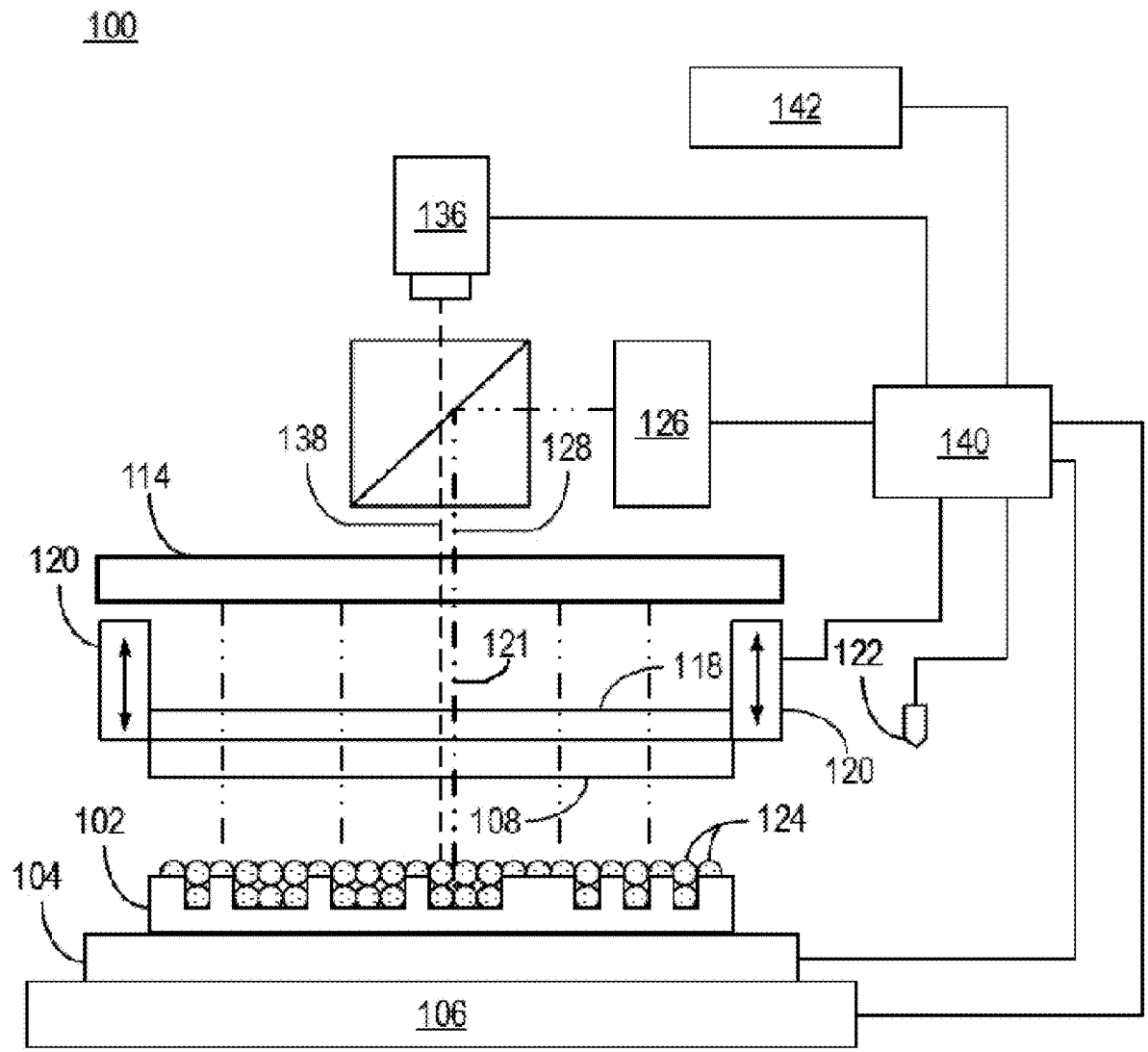
FIGS. 1A and 1B include an illustration of a side view of an exemplary system.
Figure 1B:
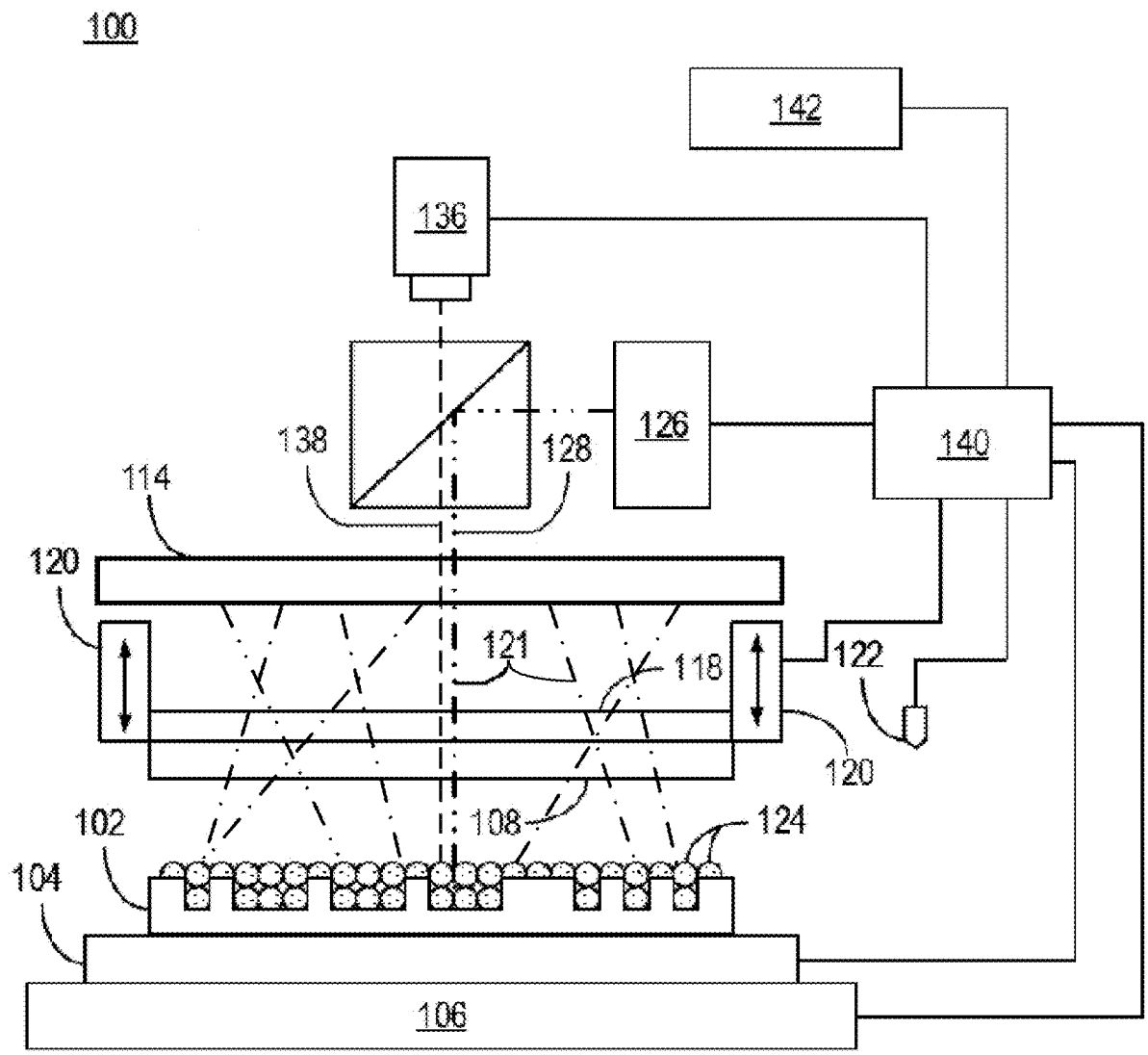

Referring to FIGS. 1A and 1B, an apparatus 100 in accordance with an embodiment described herein can be used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ-, and φ-axes. The substrate positioning stage 106, the substrate 102, and the substrate chuck 104 may also be positioned on a base (not shown). The substrate positioning stage may be a part of a positioning system.

Figure 2A:
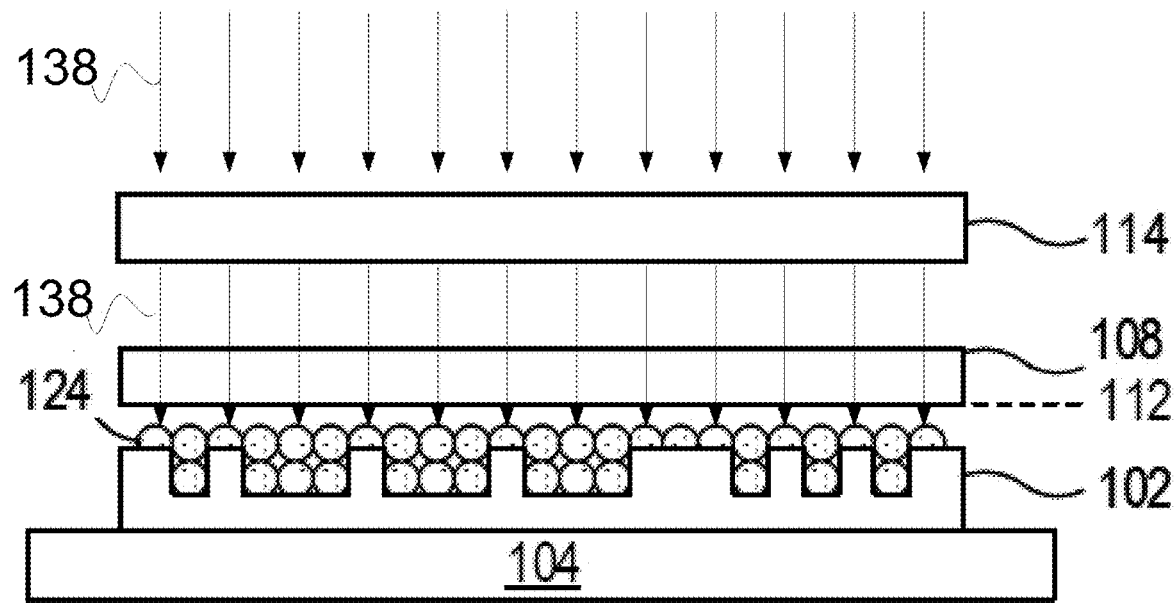
FIGS. 2A to 2D include an illustration of a planarization process.

Spaced apart from the substrate 102 is a superstrate 108. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to UV light. Superstrate 108 can have a working surface 112 facing substrate 102, as seen in FIG. 2A. Surface 112 is generally of the same areal size or slightly smaller as the surface of the substrate 102. Surface 112 of superstrate 108 can include a planar contact surface. In another embodiment, the contact surface of superstrate 108 can include features that define any original pattern that forms the basis of a pattern to be formed on the substrate 102.

Superstrate 108 may be coupled to or retained by a superstrate chuck 118. The superstrate chuck 118 may be, but is not limited to, vacuum chuck, pin-type chuck, groove-type chuck, electrostatic chuck, electromagnetic chuck, and/or other similar chuck types. The superstrate chuck 118 may be configured to apply stress, pressure, and/or strain to superstrate 108 that varies across the superstrate 108. In an embodiment the superstrate chuck is likewise readily transparent to UV light. The superstrate chuck 118 may include a system such as a zone based vacuum chuck, an actuator array, a pressure bladder, etc., which can apply a pressure differential to a back surface of the superstrate 108 to cause the superstrate 108 to bend and deform.

The superstrate chuck 118 may be coupled to a planarization head 120 which is a part of the positioning system. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, z-, θ-, ψ-, and φ-axis).

The apparatus 100 may further comprise a fluid dispenser 122. The fluid dispenser 122 may also be movably coupled to the bridge. In an embodiment, the fluid dispenser 122 and the planarization head 120 share one or more of all positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 may further comprise a camera 136 positioned to view the spread of formable material 124 as the superstrate 108 contacts the formable material 124 during the planarization process. FIG. 1 illustrates an optical axis path 138 of the field camera's imaging field. As illustrated in FIGS. 1A and 1B, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

As can be seen in FIG. 1A, the optical axis path 138 can go through a diffusing element 114 prior to reaching the superstrate chuck 118 holding the superstrate 108. FIG. 1A shows the diffusing element 114 can be in a first operational state where imaging light can pass through the diffusing element 114 with minimal diffusion providing for a high camera imaging resolution. The diffuser 114 can have a scatter range—defined by the exiting angle variation, i.e. the difference in angles between a minimum angle and a maximum angle as beams exit the diffusing element 114—greater than or equal to 0 degrees and less than 5 degrees in the first operational state after passing through the diffusing element 114. FIG. 1A illustrates the exposure path 128 can be a collimated light prior to reaching the diffusing element 114 and shows the exposure path 121 can be a collimated light after going through the diffusing element 114. In one embodiment, the light exiting the diffusing element 114 can within 5 degrees of the light entering the diffusing element 114. As such, an individual skilled in the art would understand that exposure path 128 would not substantially change after passing through the diffusing element 114 when the diffusing element 114 is in the first operational state.

The apparatus 100 may further comprise a curing system that includes a radiation source 126 that directs actinic energy, for example, UV radiation, along an exposure path 128. The planarization head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 124. The radiation source 126 directs the actinic energy along the exposure path 128 through the superstrate chuck 118. Since the superstrate chuck 118 can contain several different geometric features, such as recessed lands or cavities that have sharp edges that lead to Fresnel diffraction, light transmissivity through the geometric features, or sharp edges, is different from light transmissivity through the planar areas of the superstrate chuck 118 when a collimated or a directed beam is passed through these features. Accordingly, the variation in light transmissivity leads to non-uniform curing of the resist and poor planarization. However, the effects seen from such features can be reduced by making the energy reaching the transparent chuck diffused in nature.

As can be seen in FIG. 1B, the exposure path 128 can go through the diffusing element 114 prior to reaching the superstrate chuck 118 holding the superstrate 108. FIG. 1B shows the exposure path 128 can be a collimated light prior to reaching a diffusing element 114 and then the exposure path 121 can become diffused light after going through the diffusing element 114. In one embodiment, the diffusing element 114 can be a tunable diffuser that can vary the extent of diffusion by varying the scatter angle when the potential cross the electrodes is changed. The diffusing element can have a second operational state when the superstrate 108 is in contact with the formable material 124 that diffuses the actinic energy prior to reaching the polymerizing material thereby providing a more uniform distribution of curing light to the resist. As such, the diffuser 114 can have a scatter range—defined by the exiting angle variation, i.e. the difference in angles between a minimum angle and a maximum angle as beams exit the diffusing element 114—of greater than 5 degrees and less than 180 degrees in the second operational state after passing through the diffusing element 114. While FIG. 1B does not show the superstrate 108 in contact with the formable material 124, this is done for illustrative purposes so that the relative position of the individual components can be easily identified, it should be understood that the diffusing element 114 can be in the second operational state when the superstrate 108 is in contact with the formable material 124, thereby diffusing the actinic energy after passing through the diffusing element 114.

The diffusing element 114 can be a tunable element. In other words, the diffusing element 114 can vary the extent of diffusion by varying the scatter angle from the first operational state to the second operational state during operation. In one embodiment, when the diffusing element 114 is in the first operational state, the imaging energy can be maintained as a collimated energy after passing through the diffusing element 114 thereby providing a clear path in which the optical axis 138 of the field camera's imaging field can view the substrate 102. In another embodiment, when the diffusing element 114 is in the second operational state, the actinic energy can be diffused after passing through the diffusing element 114 thereby reaching the formable material at different angles and thereby curing the formable material in a more uniform pattern. Accordingly, during operation, the energy passing through the diffusing element 114 can advantageously be either collimated or diffused, depending on the step of processing. While lining up the superstrate 108 and substrate 102, the energy passing through the diffusing element 114 can be collimated to provide an accurate view. In a separate processing step, however, while the superstrate 108 is in contact with the substrate 102, the energy passing through the diffusing element 114 can be diffused to provide a more uniform curing process.

In one embodiment, the diffusing element 114 can be between an optical element and the superstrate chuck 118. In one embodiment, the diffusing element 114 can be between the camera 136 and the substrate 102. In another embodiment, the diffusing element 114 can be adjacent to the planarizing head 120. The diffusing element 114 can direct one or more light beams through the superstrate 108. In one embodiment, the diffusing element can have a length that is wider than the length of the superstrate chuck 118.

The apparatus 100 may be regulated, controlled, and/or directed by one or more processors 140 (controller) in communication with one or more components and/or subsystems such as the substrate chuck 104, the substrate positioning stage 106, the superstrate chuck 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, either the planarization head 120, the substrate position stage 106, or both vary a distance between the superstrate 108 and the substrate 102 to define a desired space (a bounded physical extent in three dimensions) that is filled with the formable material 124. For example, the planarization head 120 may be moved toward the substrate and apply a force to the superstrate 108 such that the superstrate 108 contacts and spreads droplets of the formable material 124 as further detailed herein.

The planarization process includes steps which are shown schematically in FIGS. 2A-2D. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The diffusing element 114 is turned to the first operational state to allow collimated light to pass through the system so that the superstrate 108 can be positioned in contact with the formable material 124. As can be seen in FIG. 2A, energy enters the diffusing element 114 as collimated beams and passes through the diffusing element 114 to exit as collimated beams. In one embodiment, the optical axis 138 of the field camera's imaging field can pass through the diffusing element as a collimated beam to aid in positioning the superstrate 108 with the substrate 102.

Figure 2B:
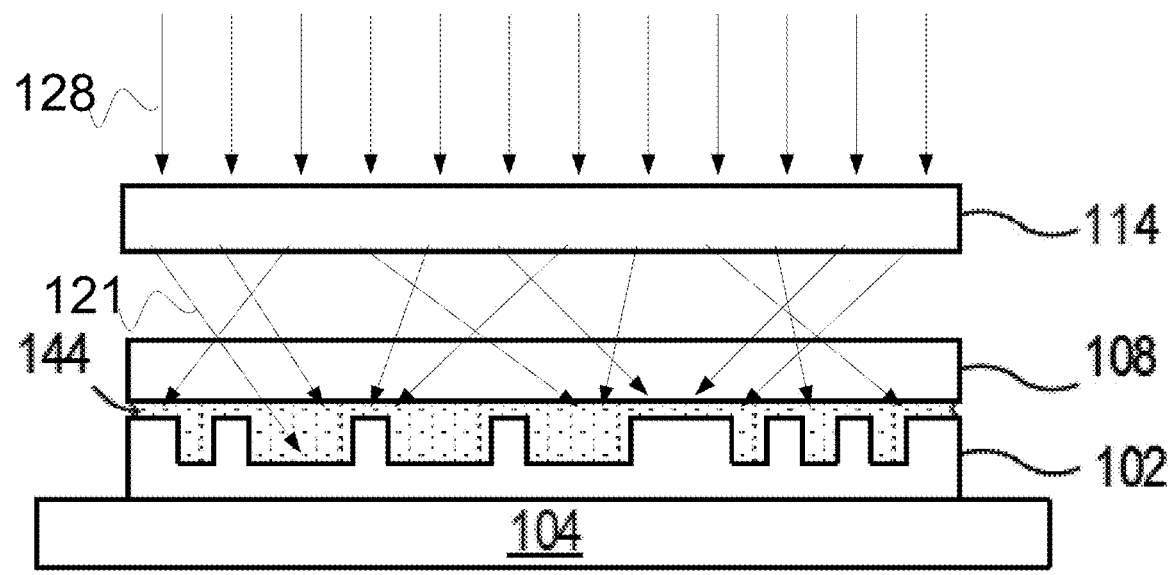
Figure 2C:
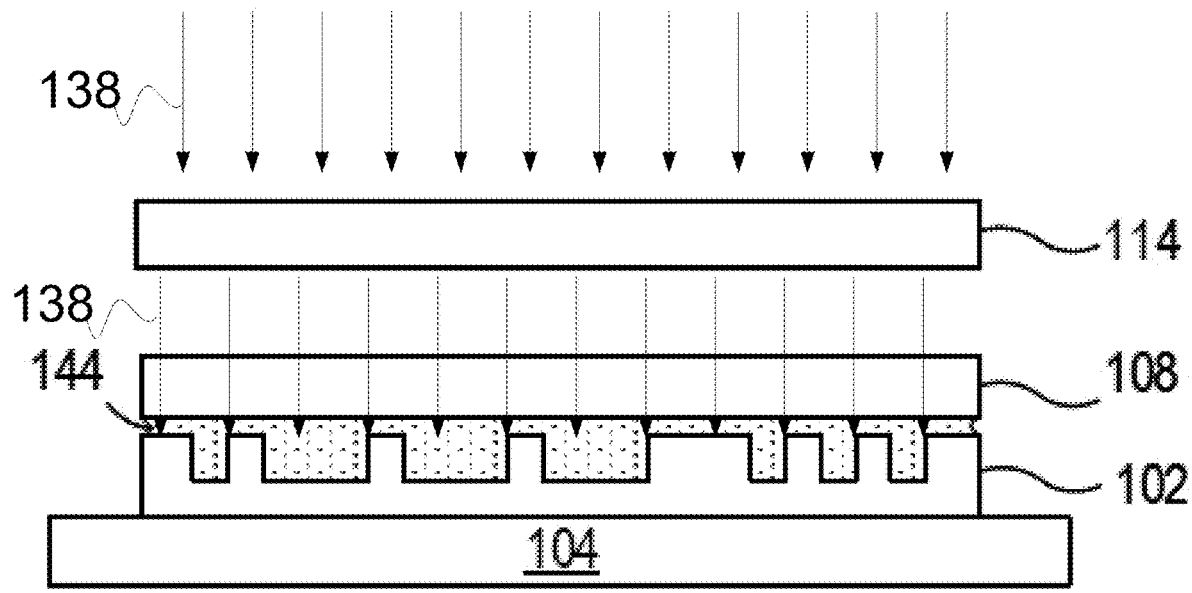

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. As seen in FIG. 2B, the diffusing element 114 can be tuned to the second operational state such that actinic beams 128 entering through the diffusing element 114 can be scattered such that the actinic beams 121 exit the diffusing element 114 at various different angles. By scattering the beams during the curing process, the diffusing element 114 provides a more uniform polymerization process. Following the polymerization process, the diffusing element 114 can once again be tuned to the first operational state providing transmission through the diffusing element 114 such that beams enter and exit the diffusing element 114 at about the same angle, as seen in FIG. 2C. As such, once again, the optical axis 138 of the field camera's imaging field can pass through the diffusing element as a collimated beam to ensure the polymerization process is complete.

Figure 2D:
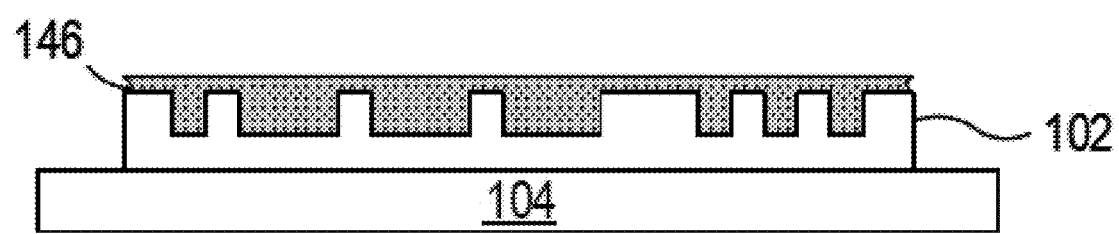

Once cured, planarized layer 146 is formed, the superstrate 108 can be separated therefrom. FIG. 2D illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

Figure 3:
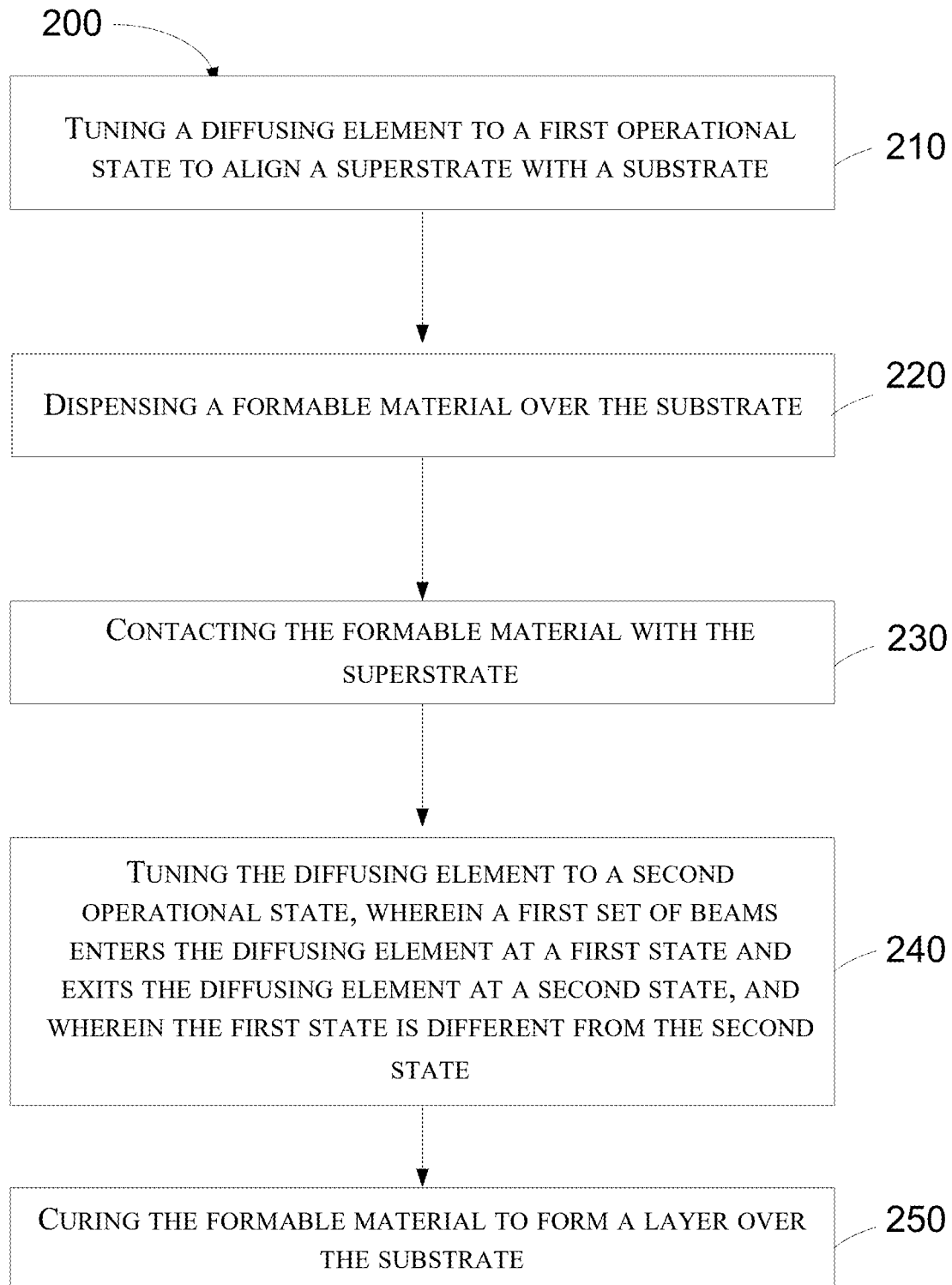
FIG. 3 includes an illustration of a method 200 of the present disclosure, according to one embodiment.

FIG. 3 includes an illustration of a method 200 of the present disclosure, according to one embodiment. The method can begin at operation 210 by aligning the superstrate 108 with the substrate 102. In one embodiment, the superstrate 108 is aligned with the substrate 102 using the camera 136. The alignment process can include tuning the diffusing element 114 to a first operational state such that energy entering the diffusing element 114 as collimated beams exit the diffusing element 114 as collimated beams. In other words, energy can enter the diffusing element 114 in one manner and exit the diffusing element 114 in a second manner wherein the first and second manner are substantially the same.

The method continues at operation 220 by dispensing a formable material 124 over a substrate 102. The substrate 102 can include a non-uniform surface topography. In other words, a surface of the substrate 102 may be non-uniform. The formable material 124 can include a polymerizable material, such as a resist. The formable material 124 can be positioned on the substrate 102 in one or more layers using techniques such as droplet dispense, spin-coating, dip coating, chemical vapor deposition (CVD), physical vapor deposition (PVD), thin film deposition, thick film deposition, or combinations thereof. The formable material 124 can be dispensed upon the substrate 102 before or after a desired volume is defined between the superstrate 108 and the substrate 102.

At operation 230, the superstrate 108 can contact the formable material 124. As the superstrate 108 contacts the formable material 124, any trapped gas particles can dissipate through the curing layer, the substrate or the superstrate 108. In one embodiment, the superstrate 108 can have a body and an amorphous fluoropolymer layer, as described above.

At operation 240, the diffusing element can be tuned to a second operational state such that actinic radiation can enter the diffusing element 114 in an entering state and exit the diffusing element 114 in an exiting state wherein the entering state is different from the exiting state. In one embodiment, the entering state is as collimated beams and the exiting state is as diffused beams. In one embodiment, the actinic radiation can be one or more light beams. The one or more light sources can be a probe-type light, such as a laser diode with beam shaping optics. In another embodiment, the one or more light sources can be a LED with DMD.

The method can continue at operation 250 by curing the formable material 124 to form a layer over the substrate 102. The formable material 124 can include a monomer or oligomer mixture that can be cured using ultraviolet light, heat, or the like. In one embodiment, curing is performed while the superstrate 108 is contacting the formable material 124. Following the curing, the diffusing element 114 can be tuned back to the first operational state to ensure the polymerization process is complete. In one embodiment, the diffusing element 114 is tuned to the first operational state such that energy enters the diffusing element in an entering state and exits the diffusing element in an exiting state and where the entering state and the exiting state are the same. In one embodiment, the entering state and the exiting state can be collimated beams. Following the curing, the superstrate 108 can be separated from the newly formed layer formed on the substrate 102.

In one embodiment a method of manufacturing an article can include tuning a diffusing element to a first operational state to align a superstrate 108 with a substrate 102 and dispensing a formable material 124 over a substrate 102. The substrate 102 can include a non-uniform surface topography. The method of manufacturing an article can also include contacting the formable material 124 with the superstrate 108, tuning the diffusing element to a second operational state, where a first set of beams enters the diffusing element 114 at an entering state 128 and exits the diffusing element at an exiting state 121, where the entering state is different from the exiting state, curing the formable material 124 to form a layer over the substrate 102, where curing is performed while the superstrate 108 is contacting the formable material 124, separating the superstrate 108 and the planar layer on the substrate 102, processing the substrate 102 on which the planar layer has been formed, and manufacturing the article from the processed substrate 102.

FIGS. 4A and 4B include a closer illustration of a diffusing element 414, which is similar to diffusing element 114, according to one embodiment. The diffusing element 414 can include a first layer 460, a second layer 462, and a third layer 464. In one embodiment, the first layer 460 can include a material selected from the group consisting of silicone, limestone, soda ash, quartz, silica, silicates, silicon dioxide, sodium oxide, sodium carbonate, calcium oxide, and any combination thereof. In one embodiment, the second layer 462 can include polyethylene terephthalate, indium tin oxide, polymer dispersed liquid crystal, or any combination thereof. The third layer 464 can include a material selected from the group consisting of silicone, limestone, soda ash, quartz, silica, silicates, silicon dioxide, sodium oxide, sodium carbonate, calcium oxide, and any combination thereof.

In FIG. 4A, the diffusing element 414 is in a second operational state. As such, the elements within the second layer 462 can alter the path of the beams 128 entering the diffusing element 414 such that the beams are scattered exiting the diffusing element 414. In FIG. 4B, the diffusing element 414 is in a first operational state As such, the elements within the second layer 462 are aligned such that beams entering the diffusing element 414 are not altered and thus exit the diffusing element 414 as collimated beams.

FIG. 5 includes an embodiment of a diffusing element 514, according to another embodiment. The diffusing element 514 can include a first layer that can be patterned into more than one section, a common second layer, and a third layer that can be separated into more than one section. In one embodiment, the first layer can be separated into three sections. In another embodiment, the first layer can be separated into as many sections as desired. In one embodiment, the first layer can be separated into at least two sections. For example, the first layer can be separated into greater than 1 and less than 50 sections. The first layer can be an electrode layer. The electrode layer can be patterned to correspond to the various geographic features on the superstrate chuck. As such, each section can be patterned to scatter the actinic light in a very specific pattern or within a specific variation of angles that correspond to the reflection seen as the beams hit the geographic features on the superstrate chuck. In one embodiment, the third layer can be separated into at least two sections. As illustrated in FIG. 5, the diffusing element 514 can include three zones, a first zone 570, a second zone 571, and a third zone 572. Each zone, 570, 571, and 572 can diffuse light at different amounts. In one embodiment, the diffusing element 514 can be patterned to selectively diffuse light. In one embodiment, the selective diffusion is in a zone that corresponds to a geographic feature on the superstrate chuck. In one embodiment, the first zone 570 can partially diffuse beams entering the diffusing element 514, the second zone 571 can allow beams to pass without alteration, and the third zone 572 can fully diffuse beams entering the diffusing element 514. In one embodiment, the beams entering the first zone 570 are in an entering state, the beams entering the second zone 571 are in a second state, the beams entering the third zone 572 are in a third state, the beams exiting the first zone 570 are in a fourth state, the beams exiting the second zone 571 are in a fifth state, and the beams exiting the third zone 572 are in a sixth state. In one embodiment, the entering state is the same as the second state and the third state, the fourth state is different from the fifth state, and the fifth state is different from the sixth state, as illustrated in FIG. 5. In another embodiment, the entering state is the same as the second state and the third state, the fourth state is different from the fifth state, and the fifth state is the same as the sixth state. In another embodiment, the entering state is the same as the second state and the third state, the fourth state is the same as the fifth state, and the fifth state is the different from the sixth state.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination.

Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of forming a planarization layer by curing a formable material on a substrate in contact with a superstrate, comprising:
   aligning the superstrate with the substrate by detecting a light beam that passes through a diffusing element in a first operational state, and wherein the first operational state of the diffusion element is a state in which light beam passes without changing state of the light beam, wherein the light beam that passes through the diffusing element in the first operational state is detected by a camera;
   dispensing the formable material over the substrate;
   contacting the formable material over the substrate with the superstrate;
   tuning the diffusing element to a second operational state by changing a potential across electrodes within the diffusing element, wherein the electrodes are on a top and a bottom of the diffusing element, wherein the light beams pass through a field formed by the electrodes on the top to the bottom of the diffusing element, and wherein the first operational state is different from the second operational state; and
   curing the formable material on the substrate by irradiating the formable material with actinic radiation beams through the diffusion element in the second operational state to form the planarization layer over the substrate while the superstrate is contacting the formable material, wherein curing the formable material through the diffusion element in the second operational state comprises directing a set of actinic radiation beams to enter the diffusing element at an entering state and exit the diffusing element at an exiting state, and wherein the entering state is different from the exiting state.

2. The method of claim 1, wherein the entering state is collimated beams.

3. The method of claim 1, wherein the exiting state is diffused beams.

4. The method of claim 1, further comprising directing a set of light beams through the diffusing element while aligning the superstrate with the substrate.

5. The method of claim 4, wherein the set of light beams enter the diffusing element as collimated beams and exit the diffusing element as collimated beams.

6. The method of claim 1, further comprising providing a camera and lighting system to align the superstrate with the substrate.

7. The method of claim 6, wherein the diffusing element is between the camera and lighting system, and the substrate.

8. The method of claim 1, wherein the diffusing element comprises a first layer, a second layer, and a third layer.

9. The method of claim 8, wherein the first layer comprises a material selected from the group consisting of silicone, limestone, soda ash, quartz, silica, silicates, silicon dioxide, sodium oxide, sodium carbonate, calcium oxide, and any combination thereof.

10. The method of claim 8, wherein the second layer comprises polyethylene terephthalate, indium tin oxide, polymer dispersed liquid crystal, or any combination thereof.

11. The method of claim 8, wherein the third layer comprises a material selected from the group consisting of silicone, limestone, soda ash, quartz, silica, silicates, silicon dioxide, sodium oxide, sodium carbonate, calcium oxide, and any combination thereof.

12. The method of claim 8, wherein the first layer is spaced apart into at least two sections, the second layer is a continuous layer, and the third layer is separated into at least two sections.

13. The method of claim 12, wherein the diffusing element comprises three zones.

14. The method of claim 13, wherein the set of actinic radiation beams exit the first zone at a different state than the beams exiting the second zone.

15. The method of claim 14, wherein the set of actinic radiation beams exit the first zone at a different state than the beams exiting the third zone.

16. The method of claim 1, wherein the second operational state of the diffusion element is a state in which the light beam is diffused when the light beam passes through the diffusion element.

17. A method of manufacturing an article, comprising:
   aligning a superstrate with the substrate, wherein aligning the superstrate with the substrate comprises tuning a diffusing element to a first operational state, and wherein the first operational state of the diffusion element is a state in which light beam passes through the diffusing element without changing state of the light beam, and wherein the light beam that passes through the diffusing element in the first operational state is detected by a camera;
   dispensing a formable material over the substrate;
   contacting the formable material over the substrate with the superstrate;
   tuning the diffusing element to a second operational state by changing a potential across electrodes within the diffusing element, wherein the electrodes are on top and bottom of the diffusing element, wherein the light beams pass through the field formed by the electrodes on the top to the bottom of the diffusing element, and, wherein the first operational state is different from the second operational state; and
   curing the formable material on the substrate to form a layer over the substrate while the superstrate is contacting the formable material, wherein curing the formable material through the diffusion element in the second operational state comprises directing a set of actinic radiation beams to enter the diffusing element at an entering state and exit the diffusing element at an exiting state, and wherein the entering state is different from the exiting state;
   separating the superstrate and the layer on the substrate;
   processing the substrate on which the layer has been formed; and
   manufacturing the article from the processed substrate.

* * * * *